United States Patent
Burton

(10) Patent No.: US 9,317,079 B2
(45) Date of Patent: Apr. 19, 2016

(54) MEDIA CONTENT DEVICE WITH CUSTOMIZED PANEL

(75) Inventor: David Robert Burton, Skipton (GB)

(73) Assignee: EchoStar UK Holdings Limited, Steeton (GB)

( * ) Notice: Subject to any disclaimer, the term of this patent is extended or adjusted under 35 U.S.C. 154(b) by 845 days.

(21) Appl. No.: 13/074,971

(22) Filed: Mar. 29, 2011

(65) Prior Publication Data

US 2012/0250260 A1  Oct. 4, 2012

(51) Int. Cl.
| | | |
|---|---|---|
| H05K 7/20 | (2006.01) | |
| H05K 13/00 | (2006.01) | |
| G06F 1/20 | (2006.01) | |
| G06F 1/18 | (2006.01) | |
| H01L 23/367 | (2006.01) | |
| H05K 1/02 | (2006.01) | |

(52) U.S. Cl.
CPC .............. *G06F 1/20* (2013.01); *G06F 1/181* (2013.01); *G06F 1/184* (2013.01); *H01L 23/367* (2013.01); *H05K 7/2039* (2013.01); *H01L 2924/0002* (2013.01); *H05K 1/0203* (2013.01); *Y10T 29/49* (2015.01)

(58) Field of Classification Search
None
See application file for complete search history.

(56) References Cited

U.S. PATENT DOCUMENTS

| | | | | |
|---|---|---|---|---|
| 4,768,286 A | * | 9/1988 | Ketcham | H05K 3/284 29/841 |
| 5,008,582 A | | 4/1991 | Tanuma et al. | |
| 5,054,193 A | * | 10/1991 | Ohms | H05K 3/3415 269/21 |
| 5,208,733 A | * | 5/1993 | Besanger | H05K 3/284 165/185 |
| 5,296,739 A | * | 3/1994 | Heilbronner et al. | 257/687 |
| 5,373,418 A | * | 12/1994 | Hayasi | H01L 23/4006 257/718 |
| 5,673,176 A | | 9/1997 | Penniman et al. | |
| 5,812,372 A | * | 9/1998 | Galyon | H01L 23/473 165/80.4 |
| 5,911,582 A | | 6/1999 | Redford et al. | |
| 5,921,757 A | | 7/1999 | Tsutsui et al. | |
| 6,025,991 A | | 2/2000 | Saito | |

(Continued)

FOREIGN PATENT DOCUMENTS

| | | |
|---|---|---|
| EP | 2138922 A1 | 12/2009 |
| WO | 03/107427 | 12/2003 |

(Continued)

OTHER PUBLICATIONS

PiezoFans, LLC—Piezo Fans and Piezoelectric Technology, "Advanced Micro-Cooling Systems" Product Description, http://piezofans.com/, download date Mar. 4, 2011, 2 pages.

*Primary Examiner* — Robert J Hoffberg
(74) *Attorney, Agent, or Firm* — Lowe Graham Jones PLLC

(57) ABSTRACT

A media device, which may take the form of a set top box (STB), includes a housing or chassis that incorporates an interface panel having selectively configured regions that cooperate with components mounted on a printed circuit board. The selectively configured regions of the interface panel may advantageously provide desired clearance or contact between the interface panel and one or more of the components. In addition, the selectively configured regions of the interface panel may be arranged to provide structural support to a top panel of the chassis while providing specific heat transfer pathways between the components and the chassis. In this manner, the interface panel may be controllably designed with a desired thermal mass and/or a desired thermal conductivity in specific regions of the interface panel by varying properties of the interface panel which may include, but are not limited to, the panel thickness and material.

13 Claims, 3 Drawing Sheets

(56) References Cited

U.S. PATENT DOCUMENTS

| | | | |
|---|---|---|---|
| 6,035,524 A * | 3/2000 | Suppa | G05B 19/4207 174/16.3 |
| 6,049,469 A | 4/2000 | Hood et al. | |
| 6,128,194 A * | 10/2000 | Francis | 361/737 |
| 6,212,074 B1 * | 4/2001 | Gonsalves et al. | 361/717 |
| 6,219,236 B1 * | 4/2001 | Hirano et al. | 361/695 |
| 6,577,504 B1 * | 6/2003 | Lofland et al. | 361/709 |
| 6,665,187 B1 * | 12/2003 | Alcoe et al. | 361/719 |
| 6,818,276 B2 | 11/2004 | Bourdelais et al. | |
| 6,946,856 B1 | 9/2005 | Tellkamp | |
| 6,982,877 B2 * | 1/2006 | Vinson et al. | 361/719 |
| 7,236,368 B2 * | 6/2007 | Maxwell et al. | 361/719 |
| 7,248,475 B2 | 7/2007 | Paydar et al. | |
| 7,310,233 B2 * | 12/2007 | Bell | 361/704 |
| 7,312,534 B2 | 12/2007 | delos Santos et al. | |
| 7,345,885 B2 * | 3/2008 | Boudreaux et al. | 361/721 |
| 7,450,387 B2 * | 11/2008 | Cheng | H01L 23/367 165/185 |
| 7,550,825 B2 | 6/2009 | Santos et al. | |
| 7,576,988 B2 * | 8/2009 | Schwarz | H05K 7/20472 361/704 |
| 7,629,400 B2 | 12/2009 | Hyman | |
| 7,742,299 B2 | 6/2010 | Sauciuc et al. | |
| 2004/0032710 A1 | 2/2004 | Fujiwara et al. | |
| 2005/0008832 A1 | 1/2005 | Santos et al. | |
| 2005/0036292 A1 | 2/2005 | Chengalva et al. | |
| 2005/0111195 A1 | 5/2005 | Wu et al. | |
| 2005/0266295 A1 | 12/2005 | Takai | |
| 2006/0198108 A1 | 9/2006 | Refai-Ahmed et al. | |
| 2007/0278683 A1 | 12/2007 | Santos et al. | |
| 2008/0135216 A1 | 6/2008 | Zhang et al. | |
| 2010/0111666 A1 | 5/2010 | Guitton et al. | |
| 2010/0261386 A1 | 10/2010 | Blum et al. | |
| 2011/0063801 A1 | 3/2011 | Lin et al. | |
| 2012/0050988 A1 | 3/2012 | Rothkopf et al. | |

FOREIGN PATENT DOCUMENTS

| | | |
|---|---|---|
| WO | 2009/058149 | 5/2009 |
| WO | 2011146302 A1 | 11/2011 |

* cited by examiner

MEDIA CONTENT DEVICE WITH CUSTOMIZED PANEL

BACKGROUND

Media devices, which may take the form of set top boxes (STBs), are configured to deliver one or more selected media content events to an audio and/or visual device. Typically, the media device connects to a television and an external signal source in which the signal (e.g., cable signal) is converted to viewable media content. However, the media device may operate with other types of audio or visual devices, which may take the form of, but are not limited to, televisions (TVs), personal computers (PCs), stereos, personal digital assistants (PDAs), surround-sound systems, and digital video recorders (DVRs). Particular media content events may be selected by a user who provides instructions or commands to the media device. For example, if the media content event is a movie, the video portion of the movie is displayed on a display of the TV, the PC, or the like. The audio portion of the movie may concurrently be presented over the speakers of the TV, the stereo, or the surround-sound system. In some instances, the media content event may be stored into a DVR or other recording device for later retrieval and presentation. The DVR may be an integrated component of the media device, or the DVR may be a stand-alone device that is communicatively coupled to the media device.

For a variety of reasons such as consumer demand, portability, spatial constraints and aesthetics, the tendency in the marketplace has been toward more streamlined components still capable of providing a high quality media content (e.g., flat screen televisions and small, wall mounted speakers). However, one of the continual challenges of making a low profile, streamlined media device is the effective transfer of heat away from heat-generating components mounted on a printed circuit board (PCB) or alternatively the effective insulation of a component adjacent to or in a vicinity of heat-generating component. Conventional media devices typically have an active cooling system employing one or more fans or blowers to move air through media device. One drawback of a conventional fan system is the amount of space (e.g., internal spatial envelope) needed within the media device to mount and adequately operate the fan. Thermal insulation, on the other hand, is usually accomplished using various pastes, epoxies, potting compounds, coatings or laminates, which may be effective, but are dependent upon assembly accuracy and internal tolerances.

Lastly, it is common practice to provide thermal pads on the PCB to obtain the requisite heat transfer from a heat generating component to the PCB. For example, conventionally mounting of a Quad Flat No leads (QFN) package or a Dual Flat No leads (DFN) package include arranging exposed thermal pads on the PCB to improve heat transfer out of the chip into the PCB, preferably by way of metal vias in the thermal pads. However, the design and implementation of thermal pads requires that many factors are in balance, such as, but not limited to, the solder paste coverage in the thermal pad region, stencil design for peripheral and thermal pad regions, type and size of the vias, circuit board thickness, surface finish on the circuit board, and cracking due to thermal or mechanical stresses around the thermal pad regions.

SUMMARY

In accordance with one aspect, an exemplary system comprises a media device having a thermally conductive chassis, which includes a top panel having an external surface exposed to an environment. An environment temperature is lower than an internal chassis temperature. A circuit board located within the chassis includes a mounting surface and components are mounted onto the mounting surface of the circuit board. Each component has a component height relative to the mounting surface of the circuit board. An interface panel has a portion of its upper surface in contact with the top panel. The interface panel includes a thickness that varies corresponding to the component heights. The interface panel may optionally include at least one surface in conductive contact with at least one of the components.

In accordance with another aspect, a media device includes a chassis that houses a circuit board and a number of components, which are mounted thereon. Each component has a component height relative to the mounting surface. The chassis may have a thermally conductive top panel, cover or lid has an external surface exposed to an ambient environment. The top panel includes a variable thickness that changes corresponding to the component heights. And, the panel may optionally include at least one surface in conductive contact with at least one of the components.

In accordance with yet another aspect, a method for assembling a chassis of a media device includes obtaining a circuit board with a plurality of components mounted thereon. Next, the circuit board is positioned in the chassis. Lastly, a panel is placed over the circuit board. The panel has a thickness that selectively varies corresponding to the component heights. The panel may optionally include at least one surface in conductive contact with at least one of the components.

BRIEF DESCRIPTION OF THE DRAWINGS

In the drawings, identical reference numbers identify similar elements or acts. The sizes and relative positions of elements in the drawings may not be necessarily drawn to scale. For example, the shapes of various elements, thicknesses and angles may not be drawn to scale, and some of these elements may be arbitrarily enlarged or positioned to improve drawing legibility. Preferred and alternative embodiments are described in detail below with reference to the following drawings.

DETAILED DESCRIPTION

A media device, which may take the form of a set top box (STB), includes a housing or chassis that incorporates an interface panel having selectively configured regions that cooperate with components mounted on a printed circuit board. The selectively configured regions of the interface panel may advantageously provide desired clearance or contact between the interface panel and one or more of the components. In addition, the selectively configured regions of the interface panel may be arranged to provide structural support to a top panel of the chassis while providing specific heat transfer pathways between the components and the chassis. In this manner, the interface panel may be controllably designed with a desired thermal mass and/or a desired thermal conductivity in specific regions of the interface panel by varying properties of the interface panel which may include, but are not limited to, the panel thickness and material. In one embodiment, the interface panel functions as the top panel of the chassis.

Figure 1:
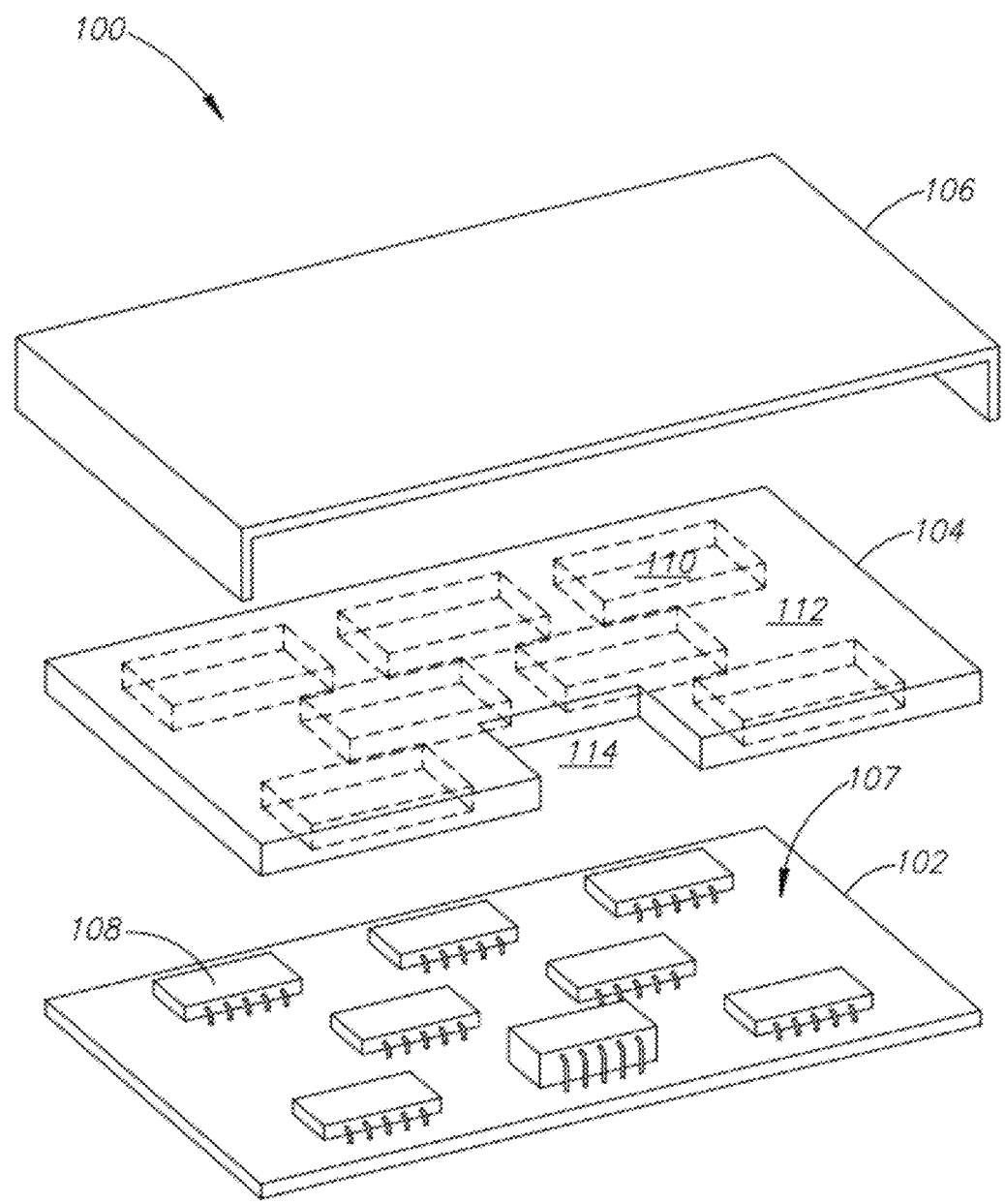
FIG. 1 is an exploded, perspective view of a portion of a media device having an interface panel with selectively configured regions and where the interface panel is positioned between a top panel of the chassis and a circuit board located within the chassis in accordance with one embodiment.

FIG. 1 shows a portion of a media device 100 that includes a circuit board 102, an interface panel 104, and a top panel 106, which functions as part of a chassis or housing. The circuit board 102 may take the form of a printed circuit board (PCB) with a mounting surface 107. A number of components 108 are supported on the mounting surface 107 and spaced apart by desired distances. The components 108 may be any type of component found on a circuit board such as, but not limited to, chips (i.e., packaged semiconductor devices) with or without hot dies, capacitors, resistors, piezoelectric devices, active and passive components, thermal pads, and various other types of packages (e.g., QFN or DFN packages). The components 108 each have a component height as measured with respect to the mounting surface 107 of the circuit board 102. The component heights may vary from one component to the next and some components may have the same height.

The interface panel 104 includes a plurality of recesses 110 having one or more adjacent ribs 112. In the illustrated embodiment, the recesses 110 and ribs 112 are configured to form independent regions, which may take the form of pockets, channels, compartments, that receive or cover one or more of the components 108. The interface panel 104 may also include openings or cutouts 114 selectively arranged to provide space for taller components. Preferably, the free ends of the ribs 112 do not extend by an amount to contact the mounting surface 107 of the circuit board 108; however one or more ribs 112 may be configured to contact the mounting surface 107. The interface panel 104 may be made from a single material or from a variety of materials and may have a variable thickness. Whatever the chosen configuration, the material properties and varied thickness may operate to selectively change a thermal mass and/or thermal conductivity of the interface panel 104 such that its configuration is customized for the components 108 as mounted on the mounting surface 107 of the circuit board 102. The recesses 110, ribs 112 and cutouts 114 may be machined (e.g., milled), etched, stamped or otherwise formed into the interface panel 104. In one embodiment, a machining pattern or template may be placed onto the interior surface of the interface panel 104 to provide guidance for producing the recesses 110, ribs 112 and cutouts 114.

The top panel 106 may be primarily supported and optionally bonded to the interface panel 104. Because of the thickness of the interface panel 104 and the arrangement of the ribs 112, the interface panel 104 may provide supplemental structural support for the top panel 106. Therefore, the top panel 106 may be made thinner than other covers or lids for a conventional media device. Moreover, the top panel 106 may be configured to be substantially thinner than a majority of the interface panel 104 having the variable thickness. The interface panel 104 extends in a direction normal (i.e., widthwise and/or lengthwise) to its thickness to have an area that approximately covers the circuit board 102.

Figure 2:
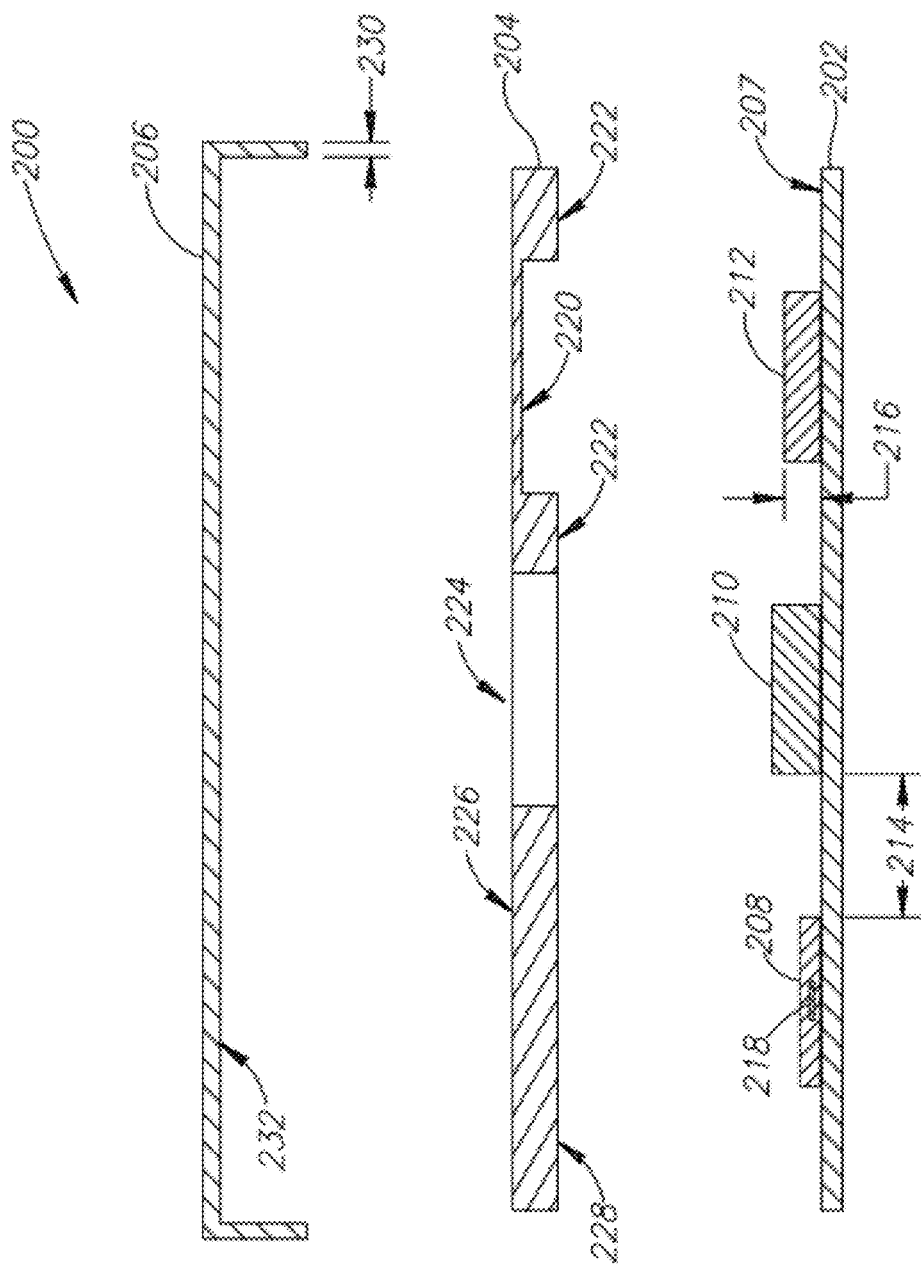
FIG. 2 is a cross-sectional view of a portion of a media device in which an interface panel includes selectively configured regions that spatially cooperate with components mounted on a circuit board in accordance with one embodiment.

FIG. 2 shows a portion of a media device 200 that includes a circuit board 202, an interface panel 204, and a top panel 206, which functions as part of a chassis or housing. The circuit board 202 may take the form of a printed circuit board (PCB) with a mounting surface 207. A number of components 208, 210 and 212 are supported on the mounting surface 207 and spaced apart by desired distances 214. Similar to the components described above, the components 208, 210 and 212 may be any type of component found on a circuit board. Each component 208, 210 and 212 has a component height 216 as illustrated on component 212. The component heights 216 are measured with respect to the mounting surface 207 of the circuit board 202. The component heights 216 may vary from one component to the next and some components may have the same height. In the illustrated embodiment, the components 208, 210 and 212 each have a different component height as compared to each other. Further, the component 208 may take the form of a heat-generating component having a hot die 218 located therein.

The interface panel 204 includes recesses 220, lands or ribs 222, an opening 224 and an upper surface 226. In the illustrated embodiment, the recess 220 is sized to receive the component 212, the opening 224 is configured to receive the component 210. The ribs 222 are preferably sized to extend downward, but not make contact with the mounting surface 207 of the circuit board 208 when the media device is assembled. The recesses 220, ribs 222 and openings 224 may be of any shape or size as would be needed to fit over a particular component. One of the ribs 222 may extend by an amount that puts the rib 222 in contact with one of the components 208. Thus in the illustrated embodiment, a rib surface 228 extends to contact the heat-generating component 208 and thereby provides a thermal conductive path through the interface panel 204 and into the top panel 206. As discussed above with the previous embodiment, the recesses 220, ribs 222 and any openings 224 may be configured to provide structural support to the top panel 206, which may have a small cross-sectional thickness 230. To prevent relative motion between the interface panel 204 and top panel 206 after assembly, an underside surface 232 of the top panel 206 may be bonded or otherwise secured to the upper surface 226 of the interface panel 204.

In another embodiment, the interface panel 104 may be mechanically compressible, either over its entirety or selectively, to accommodate stack up of mechanical tolerances during assembly and/or to provide predictable surface pressure (e.g., positive pressure) on certain components to ensure good thermal conduction where required. Additionally or alternatively, air gaps or some other thermal insulator may be included between the interface panel 104 and the lid or top panel of the chassis to eliminate "hotspots" on the cover thereby reducing touch temperature of the lid in key areas and spreading the thermal load over a larger surface area of the lid.

Figure 3:
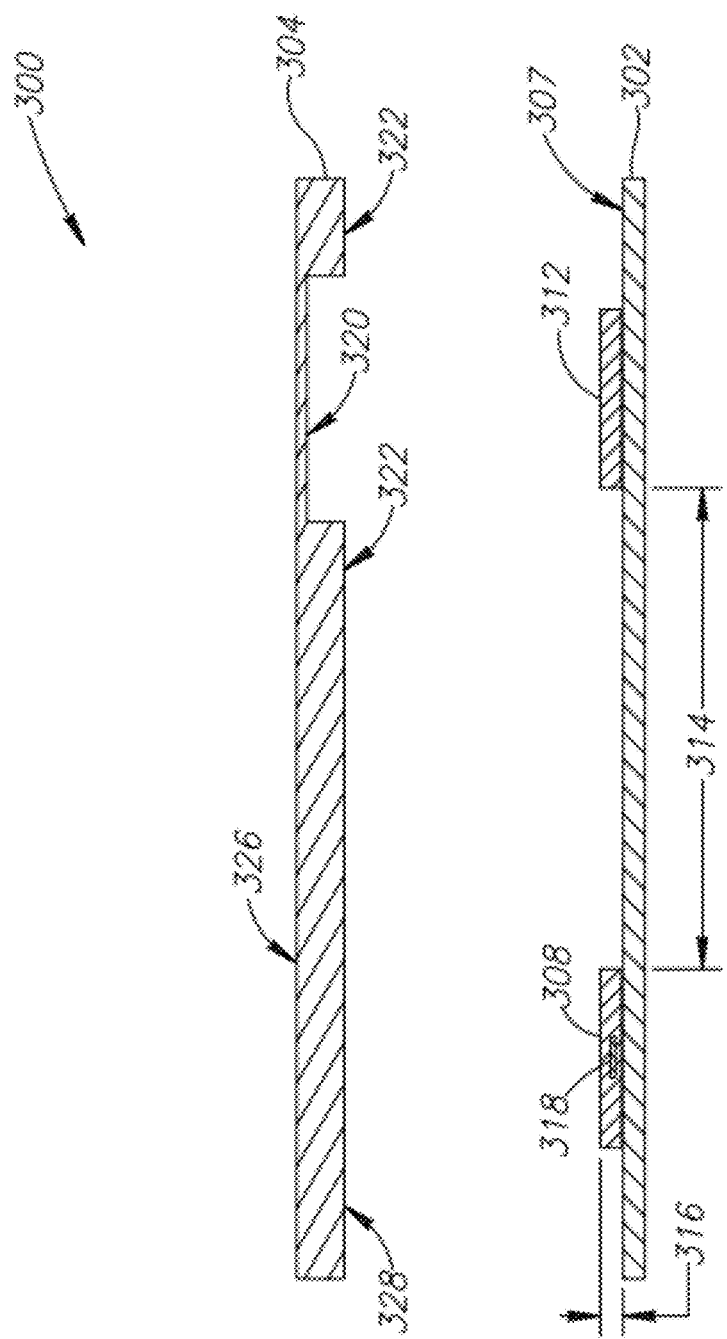
FIG. 3 is a cross-sectional view of a portion of a media device in which a top panel of a chassis includes selectively configured regions that spatially cooperate with components mounted on a circuit board in accordance with one embodiment.

FIG. 3 shows a portion of a media device 300 that includes a circuit board 302 and a top panel 304, which functions as part of a chassis or housing. The media device 300 differs than the previous embodiment only in that the top panel 304 takes the place of the interface panel, or otherwise stated the top panel 304 of the illustrated embodiment has been integrated with the interface panel 204 or vice-versa. Accordingly, the reference numerals in FIG. 3 are merely incremented by one hundred and refer to like aspects or features as compared to FIG. 2. And for purposes of brevity, the like aspects or features will not be described in detail herein.

The circuit board 302 may take the form of a printed circuit board (PCB) with a mounting surface 307. By way of example, two components 308 and 312 are supported on the mounting surface 307 and spaced apart by a desired distance 314. Again, the components 308 and 312 may be any type of component found on a circuit board. Each component 308 and 312 has a component height 316 as illustrated on component 308. The component heights 316 are measured with respect to the mounting surface 307 of the circuit board 302. The component heights 316 may vary from one component to the next and some components may have the same height. In the illustrated embodiment, the component 208 is a heat-generating component having a hot die 318 located therein.

The integrated top panel 304 includes a recess 320 and adjacent lands or ribs 322 having a free surface 328 that may be placed into thermal, conductive contact with the component 308 to provide a thermal pathway to an ambient environment 329. The recesses 320 and ribs 322 may be arranged and configured to provide structural robustness for the panel 304.

It should be emphasized that the above-described embodiments are merely possible examples of implementations of the invention. Many variations and modifications may be made to the above-described embodiments. All such modifications and variations are intended to be included herein within the scope of this disclosure and protected by the following claims.

The invention claimed is:

1. A media device comprising:
a thermally conductive chassis having a thermally conductive top panel with an external surface exposed to an environment in which an environment temperature is lower than an internal chassis temperature and an underside surface opposing the external surface of the top panel;
a circuit board located within the chassis, the circuit board having a mounting surface;
a plurality of components mounted onto the mounting surface of the circuit board, each of the components having a component height relative to the mounting surface of the circuit board; and
a thermally conductive interface panel with at least one opening or cutout extending therethrough, the interface panel comprising:
an upper surface in direct thermal contact with and bonded to the underside surface of the top panel;
a plurality of recessed portions; and
a plurality of rib portions,
wherein the least one opening or cutout surrounds a majority of at least a first one of the plurality of components,
wherein each of the recessed portions of the interface panel have a thickness that selectively varies corresponding to the component height of an associated at least one of a plurality of second ones of the components,
wherein the rib portions extend farther from the upper surface of the interface panel than the recessed portions,
wherein at least one of the recessed portions is in direct thermal contact with at least one heat-generating component of the second ones of the plurality of components to provide a thermal conductive path from the at least one heat-generating component through the interface panel and into the top panel, and
wherein the bonded upper surface of the interface panel corresponding to the rib portions provide supplemental structural reinforcement to the chassis.

2. The media device of claim 1, wherein the variable thickness recessed portions are adjacent to at least one of the plurality of rib portions.

3. The media device of claim 2, wherein the rib portions include free ends spaced apart from the mounting surface of the circuit board.

4. The media device of claim 2, wherein the bonded upper surface of the interface panel corresponding to the rib portions are arranged to provide supplemental structural reinforcement for the top panel of the chassis.

5. The media device of claim 1, wherein the top panel of the chassis is thinner than a majority of the interface panel having the variable thickness.

6. The media device of claim 1, wherein the interface panel extends in a direction normal to the thickness to have an area that approximately covers the circuit board.

7. The media device of claim 1, wherein at least one of the plurality of components mounted on the circuit board is a heat-generating component and at least a portion of the interface panel is in direct thermal contact with the heat-generating component.

8. The media device of claim 1, wherein at least one of the plurality of rib portions of the interface panel includes at least one surface in thermal conductive contact with at least one of the components.

9. A media device comprising:
a circuit board having a mounting surface;
a plurality of components mounted onto the mounting surface of the circuit board, each of the components having a component height relative to the mounting surface of the circuit board; and a thermally conductive chassis comprising:
a thermally conductive top panel with an external surface exposed to an environment in which an environment temperature is lower than an internal chassis temperature and an underside surface opposing the external surface of the top panel; and
a thermally conductive interface panel,
wherein the interface panel is defined by an upper surface in direct thermal contact with and bonded to the underside surface of the top panel,
wherein the interface panel has at least one opening or cutout extending therethrough that surrounds a majority of at least a first one of the plurality of components,
wherein the interface panel has a plurality of rib portions and a plurality of recessed portions, the interface panel has a thickness that selectively varies corresponding to the component heights of second ones of the plurality of components to define the plurality of recessed portions,
wherein a thickness of each of the recessed portions corresponds to the component height of a respective at least second one of the plurality of components,
wherein at least one of the recessed portions is in direct thermal contact with at least one heat-generating component of the second ones of the plurality of components to provide a thermal conductive path from the at least one heat-generating component through the interface panel and into the top panel,
wherein the rib portions extend farther from the upper surface of the interface panel than the adjacent recessed portions, and
wherein the bonded upper surface of the interface panel corresponding to at least one rib portion of the plurality of ribs provides supplemental structural reinforcement to the chassis.

10. The media device of claim 9, wherein the rib portions include free ends spaced apart from the mounting surface of the circuit board.

11. The media device of claim 9, wherein at least one of the plurality of rib portions that has a surface in thermal conductive contact with at least one of the components.

12. A method for assembling a chassis of a media device, the method comprising:
obtaining a circuit board with a plurality of components mounted onto a mounting surface of the circuit board, each of the components having a component height;
positioning the circuit board within the chassis of the media device; and placing a thermally conductive panel over the circuit board, the panel comprising:

a thermally conductive top panel with an external surface exposed to an environment in which an environment temperature is lower than an internal chassis temperature and an underside surface opposing the external surface of the top panel; and a thermally conductive interface panel, wherein the interface panel is defined by an upper surface in direct thermal contact with and bonded to the underside surface of the top panel, wherein the interface panel has a plurality of rib portions and a plurality of recessed portions, the interface panel has a thickness that selectively varies corresponding to the component heights of first ones of the plurality of components to define respective ones of the plurality of recessed portions, wherein the rib portions extend farther from the upper surface than adjacent recessed portions, wherein the interface panel is defined by at least one opening or cutout extending therethrough, such that the least one opening or cutout surrounds a majority of at least a second one of the plurality of components, wherein at least one of the recessed portions is in direct thermal contact with at least one heat-generating component of the second ones of the plurality of components to provide a thermal conductive path from the at least one heat-generating component through the interface panel and into the top panel, and wherein the bonded upper surface of the interface panel corresponding to at least one rib portion of the plurality of ribs provides supplemental structural reinforcement to the chassis.

13. The method of claim 12, wherein at least one of the rib portions of the interface panel includes at least one surface in conductive contact with at least one of the components of the circuit board.

* * * * *